(12) United States Patent
Su et al.

(10) Patent No.: US 7,009,285 B2
(45) Date of Patent: Mar. 7, 2006

(54) OPTOELECTRONIC SEMICONDUCTOR COMPONENT

(75) Inventors: Hung-Yuan Su, Taipei (TW); Chung-Chan Wu, Taipei (TW); Shu-Yun Su, Pan Chiao (TW)

(73) Assignee: Lite-on Technology Corporation, Taipei (TW)

( * ) Notice: Subject to any disclaimer, the term of this patent is extended or adjusted under 35 U.S.C. 154(b) by 0 days.

(21) Appl. No.: 10/912,061

(22) Filed: Aug. 6, 2004

(65) Prior Publication Data

US 2005/0205974 A1   Sep. 22, 2005

(30) Foreign Application Priority Data

Mar. 19, 2004   (TW) .............................. 93204267 U

(51) Int. Cl.
*H01L 23/02* (2006.01)
(52) U.S. Cl. .................. 257/680; 257/678; 257/81; 257/99; 257/100
(58) Field of Classification Search ........... 257/680, 257/690, 678, 81, 99, 100
See application file for complete search history.

(56) References Cited

U.S. PATENT DOCUMENTS

| | | | |
|---|---|---|---|
| 5,130,761 A * | 7/1992 | Tanaka | 257/88 |
| 6,376,902 B1 * | 4/2002 | Arndt | 257/678 |
| D478,877 S | 8/2003 | Hoshiba | |
| 6,717,256 B1 * | 4/2004 | Suzuki et al. | 257/691 |
| 2004/0223339 A1 * | 11/2004 | Tsuei et al. | 362/555 |
| 2005/0077532 A1 * | 4/2005 | Ota et al. | 257/98 |

FOREIGN PATENT DOCUMENTS

TW   315528   9/1997

\* cited by examiner

*Primary Examiner*—Jasmine Clark
(74) *Attorney, Agent, or Firm*—Birch, Stewart, Kolasch & Birch, LLP

(57) ABSTRACT

An optoelectronic semiconductor component applies to a surface mount component of an optoelectronic semiconductor. The optoelectronic semiconductor component has one or more semiconductor chip secured on a chip carrier. The chip carrier is a part of a lead frame, and another part of the lead frame is formed with an independent connection part as a contact of the semiconductor chip. An encapsulation body centers on the semiconductor chip and encircles part of the chip carrier and the independent connection part to form an annular ellipsoid for reflecting or receiving radiation of the semiconductor chip. The encapsulation body has a recess and a window part filling the recess. The window part is composed of materials for transforming the optical characteristics of the semiconductor chip. Part of the chip carrier and the independent connection part extend out the encapsulation body to form outside contacts as a SMT component.

16 Claims, 7 Drawing Sheets

OPTOELECTRONIC SEMICONDUCTOR COMPONENT

BACKGROUND OF THE INVENTION

This Nonprovisional application claims priority under 35 U.S.C. 119(a) on patent application Ser. No(s). 93204267 filed in Taiwan, Republic of China on Mar. 19, 2004, the entire contents of which are hereby incorporated by reference.

1. Field of the Invention

The present invention relates to an optoelectronic semiconductor component, and particularly to an SMT-type (surface mounted technology-type) optoelectronic semiconductor component for illumination that can be applied as a backlight source or a light interceptor.

2. Description of the Prior Art

LED (Light Emitting Diode) is a kind of solid-state illuminant that is small-scale and has high lighting efficiency. It has a long lifespan and high stability. LED is adopted as various types of light sources, such as a light source for a monitor, a backlight board, a traffic signal, emergency exits, or decorative illumination, because LED is a kind of semiconductor component.

Similar optoelectronic semiconductor modules have been disclosed, as in U.S. Pat. No. D478877 (shown in FIGS. 1 and 2) which has been issued on Aug. 26, 2003 and R.O.C. patent number 315528 (shown in FIGS. 3 and 4) which has been issued on Sep. 11, 1997. The above-mentioned patents disclose a kind of radiation-emitting or radiation-receiving semiconductor module, which has one or more emitting or receiving semiconductor chip fixed on a chip carrier of a lead frame. A portion on which the semiconductor chip fixed is of a plane-type or formed as a nest. An inner surface of the nest is designed as a reflecting curved surface for emitting or receiving light. The semiconductor chip and at least one part of the chip carrier are encircled by an encapsulation body. The encapsulation body defines a reflecting curved surface for emitting or receiving light, thereby forming an optoelectronic semiconductor module.

The above-mentioned prior arts have some problems, which are described as follows:

1. In U.S. Pat. No. D4778877S of the prior art, an optoelectronic semiconductor module 80 includes a chip carrier 82 formed by a lead frame. The chip carrier 82 lacks a chip central position mark, so a chip 84 cannot be fixed accurately and results in the semiconductor chip 84 emitting disproportionately. Moreover, an encapsulation body 86 is a polyhedron and has an asymmetrical structure, so that it is effected easily by outside forces. For example, when the semiconductor chip 84 is illuminated, the encapsulation body 86 is heated and the resulting stress is not equalized easily, which will deform an optical reflection curved surface 88 and the radiating light of the semiconductor chip 84 will not be well-proportioned.

2. In R.O.C. patent number 315528 of the prior art, an optoelectronic semiconductor module 90 includes a chip carrier 92, an independent link-part 94, and an encapsulation body 96 encircling the chip carrier 92 and the independent link-part 94. The chip carrier 92 and the independent link-part 94 respectively extend under the encapsulation body 96 to form outer electric contacts 97, 98. Such a structure cannot make the light direction parallel to the PCB, thus limiting the use thereof.

Therefore, the optoelectronic semiconductor module of the prior art still has some inconvenience and disadvantages to be improved.

SUMMARY OF THE INVENTION

The present invention provides an optoelectronic semiconductor component that has an improved encapsulation body for resisting the influence of outer forces and further lowering total strain, in particular the deformation of an optical reflection curved-surface. Therefore, the curvature precision of the optical reflection curved-surface is increased, the illumination efficiency of the semiconductor chip is enhanced, and emission is uniform.

The present invention further provides an optoelectronic semiconductor component that fixes the chip accurately, so that the semiconductor chip emits uniformly and increases the combinative ability of the chip with the chip carrier of lead frame, therefore enhancing the reliability of the optoelectronic semiconductor component.

The present invention provides an optoelectronic semiconductor component, which comprises a lead frame, at least one radiation-emitting/or radiation-receiving semiconductor chip, an encapsulation body, an optical window part, and a pair of outside connecting parts. The lead frame has a chip carrier and an independent link-part. The chip carrier is formed with a central position mark thereon and defined as an inner electrical contact. The independent link-part is another inner electrical contact. The semiconductor chip is secured on the chip carrier and is electrically connected with the chip carrier and the independent link-part via leads, respectively. The encapsulation body is formed with an axial-symmetrical arc section, which is centered on the semiconductor chip. An inner surface of the encapsulation body encircles a part of the chip carrier and the independent link-part to define an annular ellipsoid. The optical window part is formed in a concave portion of the annular ellipsoid and is filled with a material for transforming optical characteristic of emitted/or received light from the semiconductor chip. The pair of outside connecting parts respectively extends from the chip carrier and the independent link-part, and is exposed by the encapsulation body as outer contacts; thereby resisting the influence of external force, reducing total strain, and increasing the curvature precision of the optical-reflecting curved surface to enhance the emitting efficiency of the semiconductor chip and solve the light loss of such kind illumination structure.

BRIEF DESCRIPTION OF THE DRAWINGS

The invention will be better understood and objects other than those set forth above will become apparent when consideration is given to the following detailed description thereof. Such description makes reference to the annexed drawings, wherein.

DESCRIPTION OF THE PREFERRED EMBODIMENT

Figure 1:
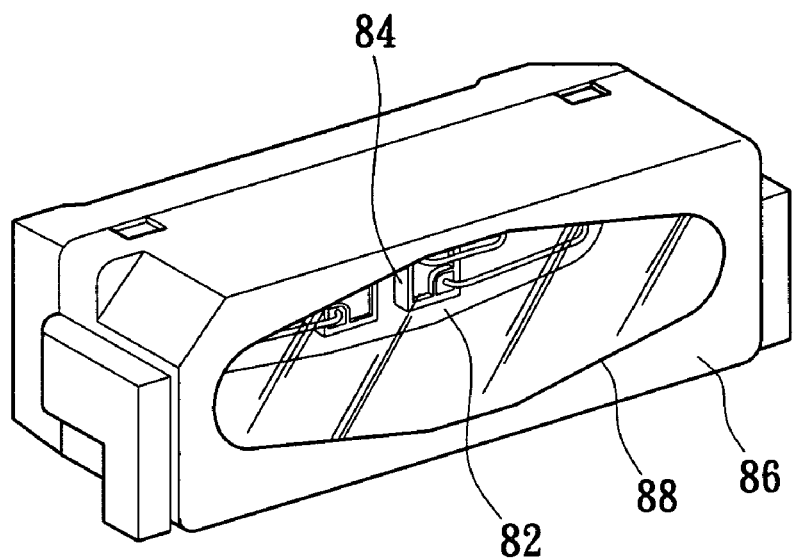
FIG. 1 is a perspective view of an optoelectronic semiconductor module of the first prior art.
Figure 2:
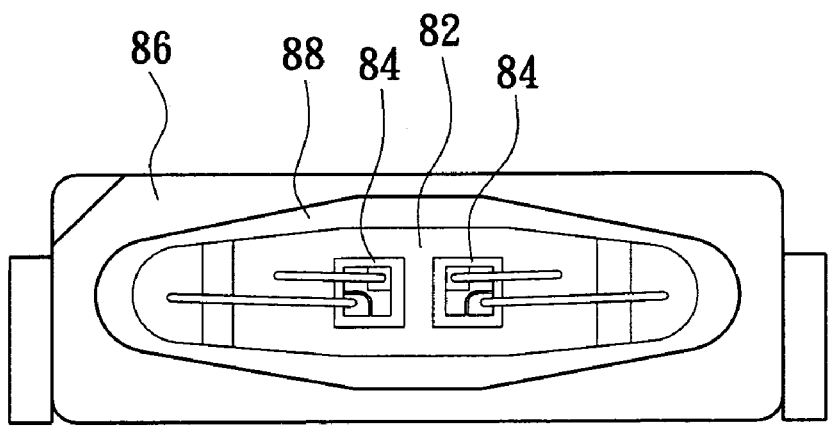
FIG. 2 is a front view of the optoelectronic semiconductor module of the first prior art.
Figure 3:
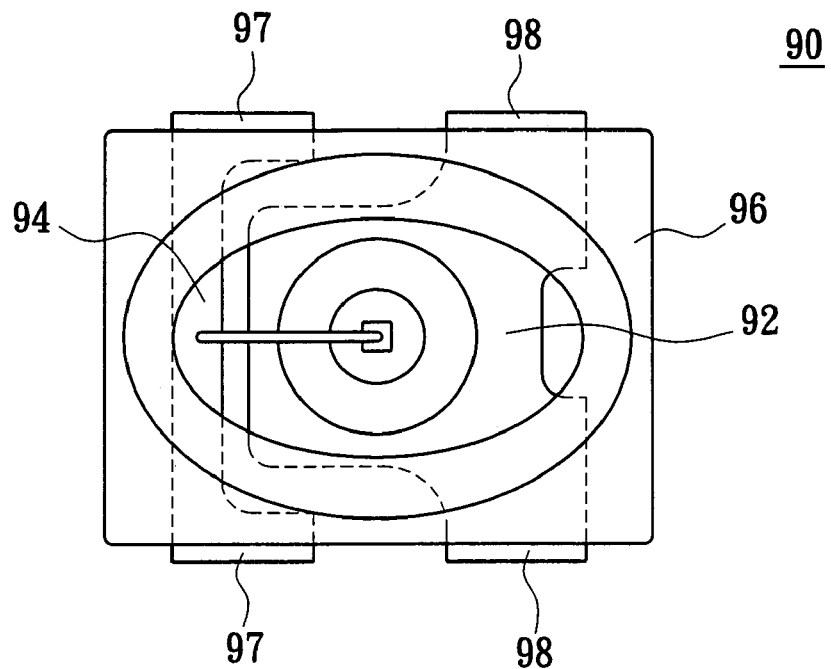
FIG. 3 is a top view of an optoelectronic semiconductor module of the second prior art.
Figure 4:
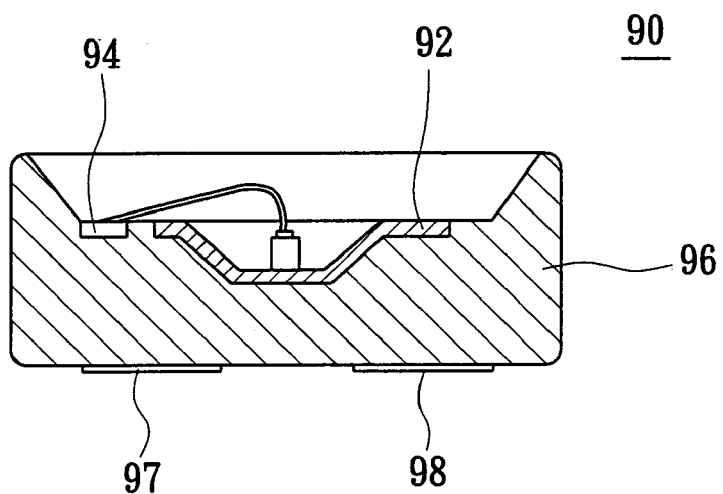
FIG. 4 is a sectional view of the optoelectronic semiconductor module of the second prior art.
Figure 5:
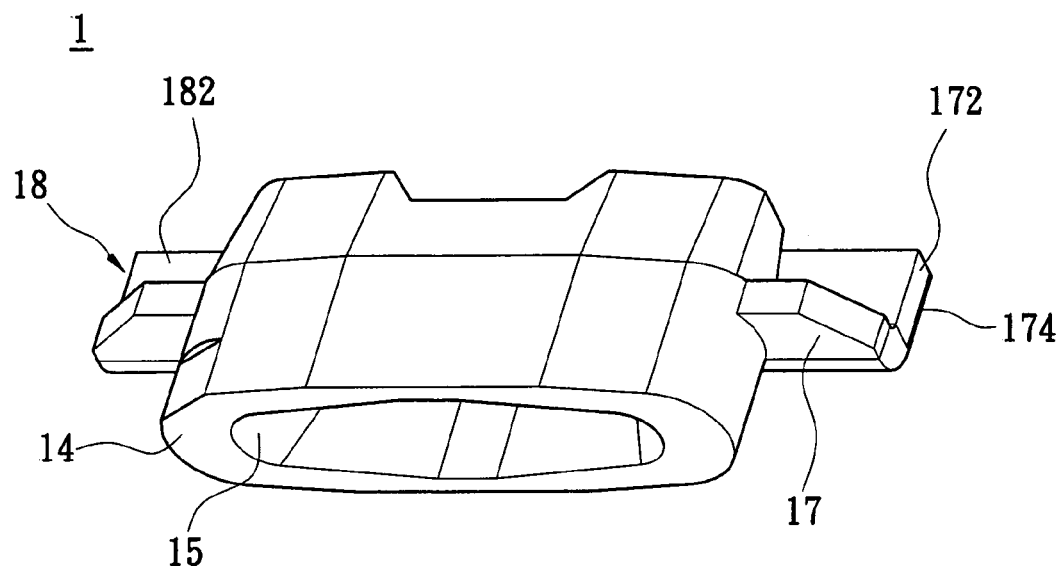
FIG. 5 is a perspective view of an optoelectronic semiconductor component according to the present invention.
Figure 6:
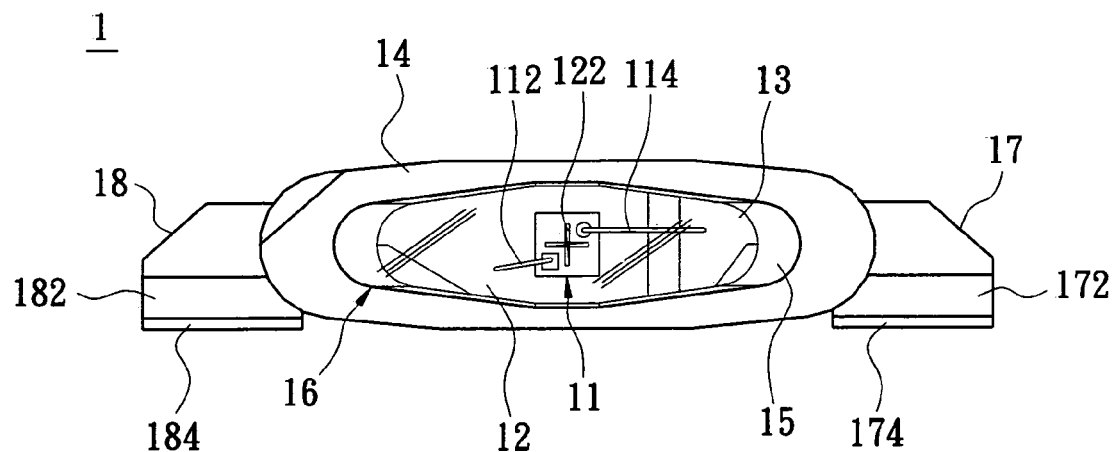
FIG. 6 is a front view of the optoelectronic semiconductor component according to the present invention.
Figure 7:
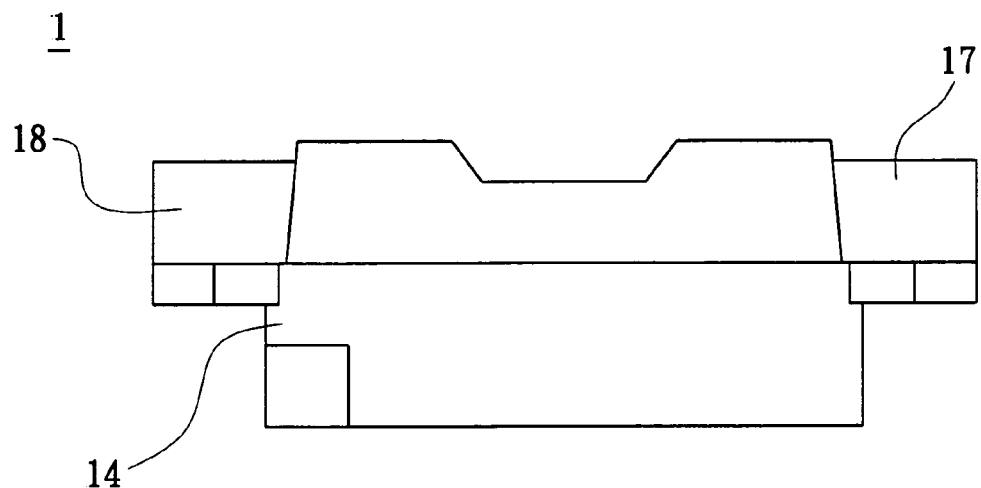
FIG. 7 is a top view of the optoelectronic semiconductor component according to the present invention.
Figure 8:
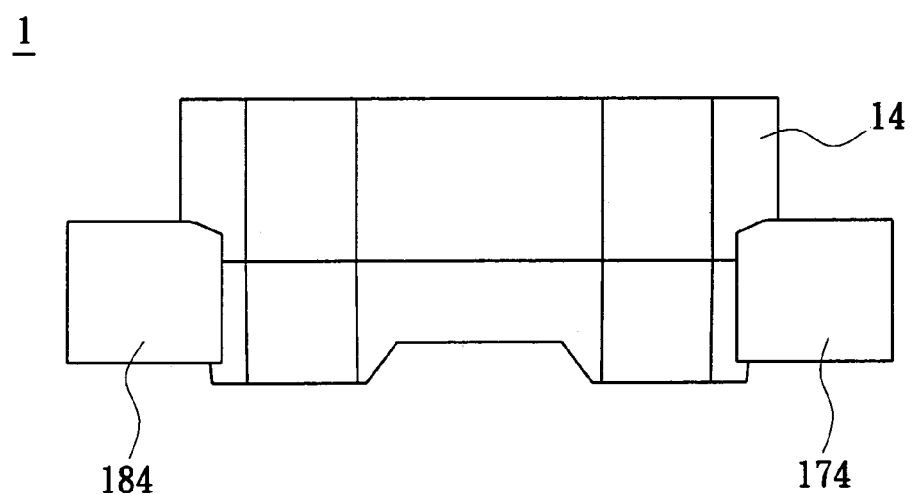
FIG. 8 is a bottom view of the optoelectronic semiconductor component according to the present invention.
Figure 9:
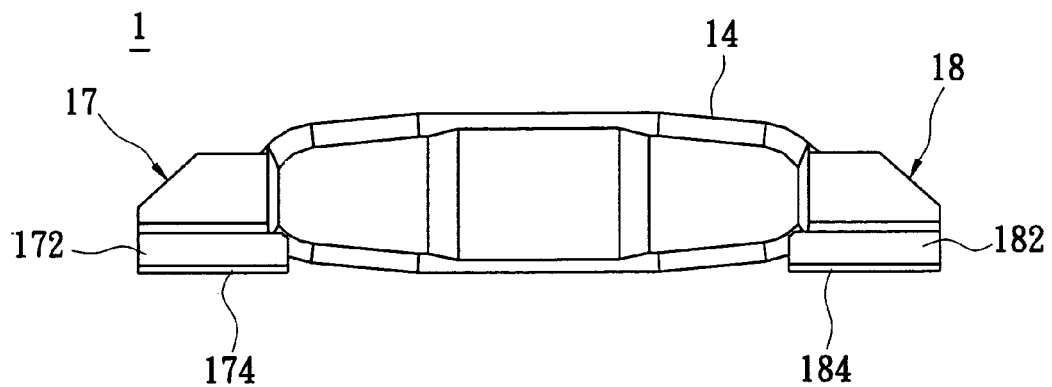
FIG. 9 is a rear view of the optoelectronic semiconductor component according to the present invention.

Referring to FIGS. 5 to 9, an optoelectronic semiconductor component of the present invention is illustrated respectively in different views. The optoelectronic semiconductor component 1 has a semiconductor chip 11, a lead frame (12, 13), an encapsulation body 14, an optical window part 16, and a pair of fixing portions 17, 18.

The semiconductor chip 11 can be one or more in number. The semiconductor chip 11 can be a radiation-emitting or a radiation-receiving semiconductor chip. The emitting semiconductor chip can be used as a light source, and the receiving semiconductor chip can be used as a light interceptor.

The lead frame has a chip carrier 12, and an independent link-part 13. The semiconductor chip 11 is secured on the chip carrier 12. The semiconductor chip 11 is electrically connected with the chip carrier 12 and the independent link-part 13 via leads 112, 114, respectively. The chip carrier 12 is formed with a central position mark 122 on a top surface thereof. The central position mark 122 is defined as an inner electrical contact, and assists in the semiconductor chip 11 being fixed accurately at a center of the chip carrier 12. Therefore, the semiconductor chip emits uniform light. The independent link-part 13 is another inner electrical contact. The central position mark 122 is concave from a top surface thereof and is shaped as a "+". The central position mark 22 can be a circle, a square, a triangular, a cross, a right-angle, or a combination of above-mentioned shapes. To increase illumination efficiency, a surface of the chip carrier 12 is further coated with a material for enhancing reflection.

The encapsulation body 14 is an annular shell, and is formed with an axial-symmetrical arc section centered on the semiconductor chip 11. An inner surface of the encapsulation body 14 encircles a part of the chip carrier 12 and the independent link-part 13 to define an annular ellipsoid 15. The annular ellipsoid 15 has an optical focus of the central position mark 122. The annular ellipsoid 15 of the encapsulation body 14 is made of a highly reflective material and forms a smooth curved surface. Alternatively, the annular ellipsoid 15 of the encapsulation body 14 is coated with a material for enhancing reflection and forms a smooth curved surface. With the encapsulation body 14, the deformation according to such a structure is more proportional and will not result in a deformation of the optical reflection curved-surface. The semiconductor chip 11 still maintains uniform emission.

The optical window part 16 is formed in a concave portion of the encapsulation body 14, which is a hollow part of the annular ellipsoid 15. The optical window part 16 is filled with a material for transforming the optical characteristics of light emitted from the semiconductor chip 11. The material for transforming the optical characteristics of light emitted from the semiconductor chip 11 can be epoxy resin or silica gel, and consists of fluorescent material, light-mixed material or pigment. For example, when a fluorescent material is added, it absorbs light emitted from the semiconductor chip and radiates another wavelength light.

The pair of fixing portions 17, 18 extend outwardly from two sides of the encapsulation body 14. The fixing portions 17, 18 are generally L-shaped, and each has a horizontal portion 172, 182 parallel to the light emission direction. The optoelectronic semiconductor component 1 further has a pair of outside connecting parts 174, 184 respectively extending from the chip carrier 12 and the independent link-part 13. The pair of outside connecting parts 174, 184 are respectively disposed beneath the horizontal portions 172, 182 to be exposed by the encapsulation body 14 as outer contacts, thereby forming the surface mounted technology component 1.

Figure 10:
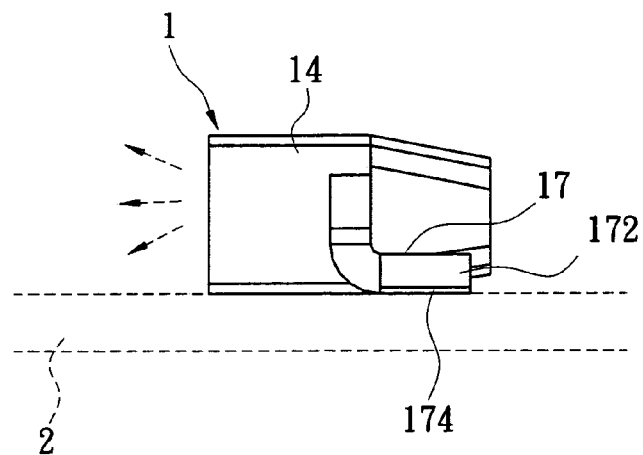
FIG. 10 is a perspective view of the optoelectronic semiconductor component assembled on a PCB according to the present invention.

FIG. 10 illustrates a perspective view of the optoelectronic semiconductor component assembled on a PCB. The outside connecting parts 174, 184 are formed on the bottom of the horizontal portions 172, 182 of the fixing portions 17, 18. The optoelectronic semiconductor component 1 is thereby soldered on a PCB 2 parallel to the radiation direction. The present invention is thus easily used as a backlight.

Figure 11:
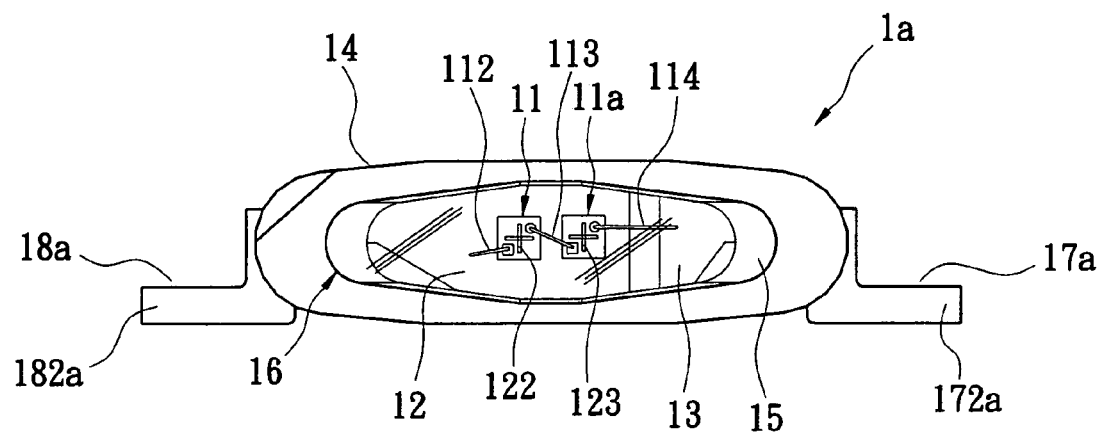
FIG. 11 is a front view of the optoelectronic semiconductor component of second embodiment according to the present invention.

FIG. 11 illustrates a front view of the optoelectronic semiconductor component of second embodiment according to the present invention. The optoelectronic semiconductor component 1a can be mounted with more than one semiconductor chips 11, 11a with different function. For example, mounting with two LED semiconductor chips to meet the requirement of better illumination and enhance the reliability of the LED semiconductor chips, or mounting with another one diode-protective chip to protect the semiconductor chip 11 from excessive current, such as a Zener diode. The Zener diode can adjust working voltage and has function of stabilizing circuit. The optoelectronic semiconductor component 1a is formed with two central position marks 122, 123 on the chip carrier 12 to orientate the semiconductor chips 11, 11a. The semiconductor chips 11, 11a are parallel or series connection via the leads 112, 113, 114.

Figure 12:
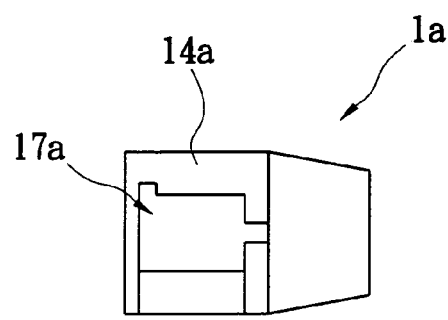
FIG. 12 is a side view of the optoelectronic semiconductor component of second embodiment according to the present invention.

FIG. 12 illustrates a side view of the optoelectronic semiconductor component of second embodiment according to the present invention. The fixing portions of the optoelectronic semiconductor component could be extending from the independent link-part 13 and the chip carrier 12 and bended as outer electric contacts. In this embodiment, the optoelectronic semiconductor component 1a has a pair of fixing portions 17a, 18a that are formed into different shape from the first embodiment. The fixing portions 17a, 18a are extending along the encapsulation body 14 downwardly and outwardly. From the front view, the fixing portions 17a, 18a are generally L-shaped and have horizontal portions 172a, 182a.

Figure 13:
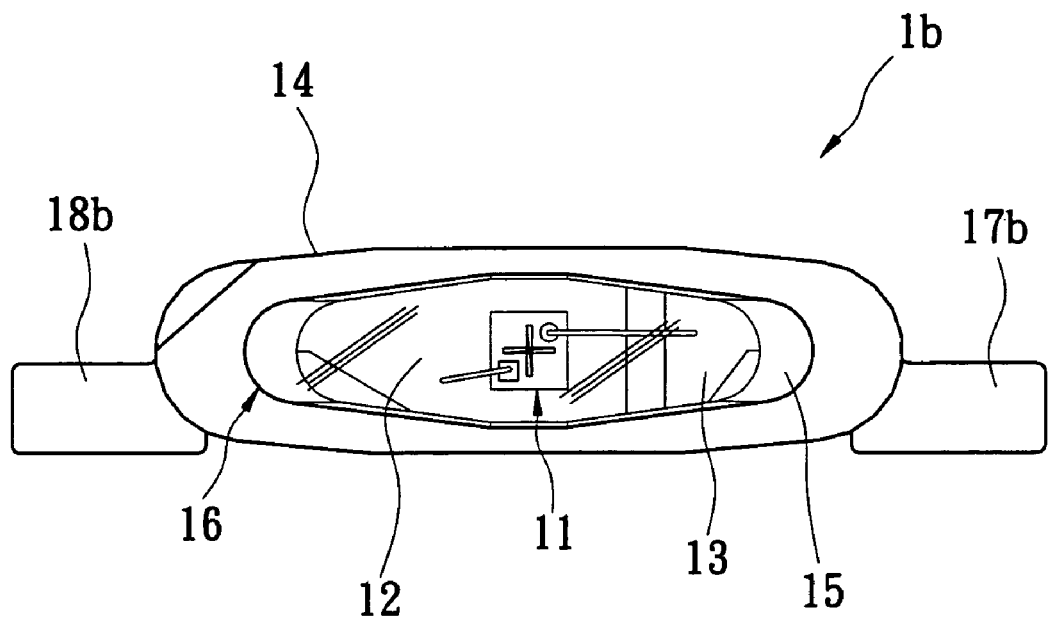
FIG. 13, is a front view of the optoelectronic semiconductor component of third embodiment according to the present invention.
Figure 14:
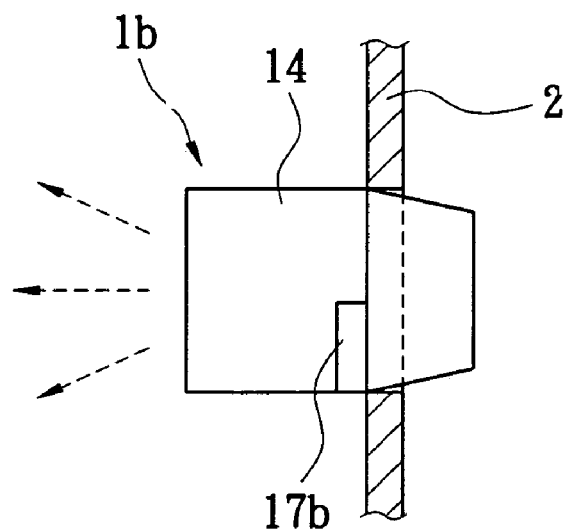
FIG. 14 is a side view of the optoelectronic semiconductor component of third embodiment according to the present invention assembled on a PCB.

FIG. 13, 14 illustrate a front view of the optoelectronic semiconductor component of third embodiment according to the present invention, and a side view of the optoelectronic semiconductor component assembled on a PCB. The fixing portions 17a, 18a of the optoelectronic semiconductor component 1a are formed into slab-shape that are extending outside the encapsulation body 14 and perpendicular to the emission direction. The optoelectronic semiconductor component 1a therefore can be soldered on PCB 2 vertically.

The geometric structure of the outer electric contacts of the present invention can reduce the contact resist and increase the heat-conductive factor to enhance the emitting efficiency of the semiconductor chip and solve the light loss of such kind illumination structure.

A summary of the characteristics and advantages of the optoelectronic semiconductor component is given as follows.

The encapsulation body 14 of the present invention is an arc with an axial-symmetrical section along inner and outer edges thereof, so that it can resist the influence of outer forces and further lower total strain. Therefore, the curvature precision of the optical reflection curved-surface is increased, illumination efficiency of the semiconductor chip is enhanced, and emission is uniform. Especially when applied as a backlight, the present invention can prevent light loss in illumination structures. The present invention provides the chip carrier 12, which is formed with a central position mark 122, so that the semiconductor chip 11 emits uniformly and increases the combinative ability of the chip 11 with the chip carrier 12 of the lead frame, therefore enhancing the reliability of the optoelectronic semiconductor component.

Although the present invention has been described with reference to the preferred embodiments thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. An optoelectronic semiconductor component, comprising:
    a lead frame having a chip carrier, and an independent link-part, said chip carrier formed with a central position mark at a central portion of the chip carrier, said central position mark being defined as an inner electrical contact, said independent link-part being another inner electrical contact;
    a semiconductor chip secured on said chip carrier, said semiconductor chip electrically connected with said chip carrier and said independent link-part;
    an encapsulation body being an annular shell, said encapsulation body having a section centered on said semiconductor chip, said section being shaped as an axial-symmetrical arc, an inner surface of said encapsulation body encircling a part of said chip carrier and said independent link-part to define an annular ellipsoid;
    an optical window part formed in a concave portion of said annular ellipsoid; and
    a pair of outside connecting parts respectively extending from said chip carrier and said independent link-part and exposed by said encapsulation body as outer contacts.

2. An optoelectronic semiconductor component, comprising:
    a lead frame having a chip carrier, and an independent link-part, said chip carrier formed with a central position mark thereon and defined as an inner electrical contact, said central position mark being shaped as a "+", said independent link-part being another inner electrical contact;
    a semiconductor chip secured on said chip carrier, said semiconductor chip electrically connected with said chip carrier and said independent link-part;
    an encapsulation body having an inner surface, said inner surface encircling a part of said chip carrier and said independent link-part to define an annular ellipsoid;
    an optical window part formed in a concave portion of said annular ellipsoid; and
    a pair of outside connecting parts respectively extending from said chip carrier and said independent link-part and exposed by said encapsulation body as outer contacts.

3. The optoelectronic semiconductor component as in claim 1, wherein the central position mark is a circle, a square, a triangular, a cross, a right-angle, or a combination thereof.

4. The optoelectronic semiconductor component as in claim 1, wherein a surface of said chip carrier is coated with a material for enhancing reflection.

5. The optoelectronic semiconductor component as in claim 1, wherein said annular ellipsoid of said encapsulation body is made of a highly reflective material and forms a smooth curved surface.

6. The optoelectronic semiconductor component as in claim 1, wherein said annular ellipsoid of said encapsulation body is coated with a material for enhancing reflection and forms a smooth curved surface.

7. The optoelectronic semiconductor component as in claim 1, wherein said annular ellipsoid of said encapsulation body is a smooth surface and is coated with a material for enhancing reflection.

8. The optoelectronic semiconductor component as in claim 1, wherein a material filled into said optical window part for transforming optical characteristic of said semiconductor chip is epoxy resin or silica gel, and comprises fluorescent material, light-mixed material or pigment.

9. An optoelectronic semiconductor component, comprising:
    a lead frame having a chip carrier, and an independent link-part, said chip carrier formed with a central position mark thereon and defined as an inner electrical contact, said independent link-part being another inner electrical contact;
    a semiconductor chip secured on said chip carrier, said semiconductor chip electrically connected with said chip carrier and said independent link-part;
    an encapsulation body having an inner surface, said inner surface encircling a part of said chip carrier and said independent link-part to define an annular ellipsoid;
    an optical window part formed in a concave portion of said annular ellipsoid;
    a pair of outside connecting parts respectively extending from said chip carrier and said independent link-part and exposed by said encapsulation body as outer contacts; and
    a pair of fixing portions extending outwardly from two sides of said encapsulation body, each fixing portion having a horizontal portion parallel to an emission direction, wherein said outside connecting parts are formed on a bottom of the horizontal portions of the fixing portions, the optoelectronic semiconductor component being thereby soldered onto a PCB parallel to an emission direction.

10. The optoelectronic semiconductor component as in claim 9, wherein the pair of fixing portions are extending from the independent link-part and the chip carrier outwardly and being bended as outer electric contacts.

11. The optoelectronic semiconductor component as in claim 10, wherein each of the fixing portion is generally L-shaped from a front view.

12. The optoelectronic semiconductor component as in claim 10, wherein each of the fixing portion is formed into slab-shape and perpendicular to emission direction.

13. The optoelectronic semiconductor component as in claim 1, wherein the chip carrier is mounted with more than one semiconductor chips.

14. The optoelectronic semiconductor component as in claim 13, wherein the semiconductor chip is a LED semiconductor chip.

15. The optoelectronic semiconductor component as in claim 14, further comprising a diode-protective chip mounted on the chip carrier.

16. The optoelectronic semiconductor component as in claim 1, wherein said semiconductor chip is a radiation-emitting semiconductor chip or a radiation-receiving semiconductor chip.

* * * * *